US011689176B2

(12) United States Patent
Ryan

(10) Patent No.: US 11,689,176 B2
(45) Date of Patent: Jun. 27, 2023

(54) POWER DIVIDER COMPRISING A PLURALITY OF (90/N)-DEGREE PHASE SHIFT CIRCUIT BLOCKS FORMED BY INDUCTOR AND CAPACITOR CIRCUITRY

(71) Applicant: AchernarTek Inc., San Diego, CA (US)

(72) Inventor: Colan Ryan, San Diego, CA (US)

(73) Assignee: ACHERNARTEK INC., San Diego, CA (US)

( * ) Notice: Subject to any disclaimer, the term of this patent is extended or adjusted under 35 U.S.C. 154(b) by 0 days.

(21) Appl. No.: 17/487,018

(22) Filed: Sep. 28, 2021

(65) Prior Publication Data

US 2022/0329225 A1 Oct. 13, 2022

Related U.S. Application Data

(60) Provisional application No. 63/173,546, filed on Apr. 12, 2021.

(51) Int. Cl.
| | |
|---|---|
| *H03H 7/48* | (2006.01) |
| *H03H 7/20* | (2006.01) |
| *H01Q 3/36* | (2006.01) |
| *H01P 1/18* | (2006.01) |
| *H01Q 5/50* | (2015.01) |
| *H01Q 1/38* | (2006.01) |
| *H01Q 13/10* | (2006.01) |
| *H01Q 1/48* | (2006.01) |
| *H01Q 9/04* | (2006.01) |
| *H01Q 21/06* | (2006.01) |

(52) U.S. Cl.
CPC ............... *H03H 7/48* (2013.01); *H01P 1/184* (2013.01); *H01Q 1/38* (2013.01); *H01Q 1/48* (2013.01); *H01Q 3/36* (2013.01); *H01Q 5/50* (2015.01); *H01Q 9/045* (2013.01); *H01Q 13/106* (2013.01); *H01Q 21/065* (2013.01); *H03H 7/20* (2013.01)

(58) Field of Classification Search
CPC .... H01P 1/18; H01P 5/12; H03H 7/18; H03H 7/20; H03H 7/21; H03H 7/19; H03H 7/48
USPC .................................................. 333/139, 124
See application file for complete search history.

(56) References Cited

U.S. PATENT DOCUMENTS

| 6,356,149 B1 * | 3/2002 | Stengel et al. ........ H03F 1/0288 |
| | | 333/139 |
| 2005/0206568 A1 | 9/2005 | Phillips |
| | | (Continued) |

*Primary Examiner* — Benny T Lee
(74) *Attorney, Agent, or Firm* — McClure, Qualey & Rodack, LLP

(57) ABSTRACT

A phase shifter circuit and a power divider are disclosed. The phase shifter circuit provides a (90/N)-degree phase shift for a signal with two or more frequencies, where N is an integer. The phase shifter circuit includes a first inductor, a first capacitor, a second inductor and a second capacitor. The first inductor is grounded, and is coupled to the first capacitor in series. The second inductor is grounded, and is coupled to the second capacitor in series. A first node between the first capacitor and the first inductor is coupled to a node between a second node between the second capacitor and the second inductor. The power divider includes plural circuit blocks cascaded in series. Each circuit block provides a (90/N)-degree phase shift for a signal with two or more operating frequencies.

17 Claims, 10 Drawing Sheets

(56) References Cited

U.S. PATENT DOCUMENTS

2006/0273972 A1    12/2006  Chandler
2014/0347143 A1*  11/2014  Oppelt ..................... H03H 7/42
                                                              333/25

* cited by examiner

POWER DIVIDER COMPRISING A PLURALITY OF (90/N)-DEGREE PHASE SHIFT CIRCUIT BLOCKS FORMED BY INDUCTOR AND CAPACITOR CIRCUITRY

RELATED APPLICATIONS

This application claims priority to U.S. Provisional Application Ser. No. 63/173,546, filed Apr. 12, 2021, which is herein incorporated by reference.

BACKGROUND

Field of the Invention

The present disclosure relates to a phase shifter circuit and a power divider that may be used in a corporate feed network of an antenna array.

Description of Related Art

A power divider is a necessary component for a corporate feed network of an antenna array. FIG. 1 is a conventional power divider 100 in accordance with prior art. The power divider 100 is a T-junction power divider with a quarter-wavelength transmission line TL' which works as a quarter-wavelength impedance transformer. One terminal of the quarter wavelength transmission line TL' is coupled to the input port P1', and the other terminal of the quarter wavelength transmission line TL' is coupled to the output ports P2' and P3'. The input port P1' is used to receive an input signal, and the output ports P2' and P3' are used to output signals divided from the input signal. The length of the quarter-wavelength transmission line TL' is a quarter of the wavelength at the operating frequency of the power divider 100. However, the power divider 100 occupies a large layout area and functions only at odd harmonics of the fundamental operating frequency corresponding to the length of the quarter-wavelength transmission line TL', which results in limited use for an array antenna system. Though various power dividers may be integrated for routing signals with different frequencies, such integration requires a multilayer substrate (such as a multilayer printed circuit board), which results in an increasing of product cost as well as design difficulty.

SUMMARY OF THE INVENTION

One aspect of the present disclosure directs to a phase shifter circuit which provides a (90/N)-degree phase shift for a signal with two or more operating frequencies, where N is an integer. The phase shifter circuit includes a first inductor, a first capacitor, a second inductor and a second capacitor. The first inductor is grounded, and is coupled to the first capacitor in series. The second inductor is grounded, and is coupled to the second capacitor in series. A first node between the first capacitor and the first inductor is coupled to a second node between the second capacitor and the second inductor.

In accordance with one or more implementations of the present disclosure, capacitances of the first capacitor and the second capacitor are substantially the same, and inductances of the first inductor and the second inductor are substantially the same.

In accordance with one or more implementations of the disclosure, the phase shifter circuit further includes a transmission line that is coupled between the first node and the second node.

In accordance with one or more implementations of the present disclosure, the transmission line is a microstrip.

In accordance with one or more implementations of the present disclosure, the phase shifter circuit further includes an inductor-capacitor (LC) circuitry that is coupled between the first node and the second node.

In accordance with one or more implementations of the present disclosure, an end of the first capacitor opposite to the first node and an end of the second capacitor opposite to the second node are an input and an output of the signal, respectively.

In accordance with one or more implementations of the present disclosure, the first capacitor and the second capacitor are variable capacitors.

In accordance with one or more implementations of the present disclosure, the first inductor and the second inductor are variable inductors.

In accordance with one or more implementations of the present disclosure, the phase shifter circuit further includes a third inductor, a third capacitor, a fourth inductor and a fourth capacitor. The third inductor is grounded, and is coupled to the third capacitor in series. The fourth inductor is grounded, and is coupled to the fourth capacitor in series. The first capacitor is coupled between the first node and a third node that is between the third capacitor and the third inductor, and the second capacitor is coupled between the second node and a fourth node that is between the fourth capacitor and the fourth inductor.

Another aspect of the present disclosure is directed to a phase shifter circuit which provides a (90/N)-degree phase shift for a signal with two or more frequencies, where N is an integer. The phase shifter circuit includes a first inductor, a first capacitor and a first transmission line. The first inductor is grounded, and is coupled to the first capacitor. The first transmission line is coupled to the first capacitor. The first transmission line, the first capacitor and the first inductor are sequentially coupled in series.

In accordance with one or more implementations of the present disclosure, the phase shifter circuit further includes a second capacitor and a second transmission line. The second capacitor is coupled to the first inductor. The second transmission line is coupled to the second capacitor. The second transmission line, the second capacitor and the first inductor are sequentially coupled in series.

In accordance with one or more implementations of the present disclosure, the phase shifter circuit further includes a second inductor and a second transmission line. The second inductor is grounded, and is coupled to a first node that is between the first transmission line and the first capacitor. One end of the second transmission line is coupled to a second node that is between the first capacitor and the first inductor.

Yet another aspect of the present disclosure is directed to a power divider which includes plural circuit blocks cascaded in series. Each circuit block provides a (90/N)-degree phase shift for a signal with two or more operating frequencies, where N is the number of circuit blocks. A first terminal of a $1^{st}$ circuit block of the plural circuit blocks is coupled to an input port of the power divider, a second terminal of an $i^{th}$ circuit block of the plural circuit blocks is coupled to a first terminal of an $(i+1)^{th}$ circuit block of the plural circuit blocks, and a second terminal of an $N^{th}$ circuit block of the plural circuit blocks is coupled to two output ports of the power divider, where i is an integer less than N.

In accordance with one or more implementations of the present disclosure, at least one circuit block includes a first capacitor, a first inductor, a second capacitor and a second inductor. The first inductor is grounded, and is coupled to the first capacitor in series. The second inductor is grounded, and is coupled to the second capacitor in series, and a first node between the first capacitor and the first inductor is coupled to a node between a second node between the second capacitor and the second inductor.

In accordance with one or more implementations of the present disclosure, the circuit block further includes a transmission line that is coupled between the first node and the second node.

In accordance with one or more implementations of the present disclosure, the circuit block further includes an inductor-capacitor (LC) circuitry that is coupled between the first node and the second node.

In accordance with one or more implementations of the present disclosure, the circuit block further includes a third inductor, a third capacitor, a fourth inductor and a fourth capacitor. The third inductor is grounded, and is coupled to the third capacitor in series. The fourth inductor is grounded, and is coupled to the fourth capacitor in series. The first capacitor is coupled between the first node and a third node that is between the third capacitor and the third inductor, and the second capacitor is coupled between the second node and a fourth node that is between the fourth capacitor and the fourth inductor.

In accordance with one or more implementations of the present disclosure, at least one circuit block includes a first inductor, a first capacitor and a first transmission line. The first inductor is grounded, and is coupled to the first capacitor. The first transmission line is coupled to the first capacitor. The first transmission line, the first capacitor and the first inductor are sequentially coupled in series.

In accordance with one or more implementations of the present disclosure, the circuit block further includes a second capacitor and a second transmission line. The second capacitor is coupled to the first inductor. The second transmission line is coupled to the second capacitor. The second transmission line, the second capacitor and the first inductor are sequentially coupled in series.

In accordance with one or more implementations of the present disclosure, the circuit block further includes a second inductor and a second transmission line. The second inductor is grounded, and is coupled to a first node that is between the first transmission line and the first capacitor. One end of the second transmission line is coupled to a second node that is between the first capacitor and the first inductor.

BRIEF DESCRIPTION OF THE DRAWINGS

The foregoing aspects and many of the accompanying advantages of this disclosure will become more readily appreciated as the same becomes better understood by reference to the following detailed description, when taken in conjunction with the accompanying drawings.

DETAILED DESCRIPTION OF THE INVENTION

The detailed explanation of the disclosure is described as following. The described preferred embodiments are presented for purposes of illustrations and description, and they are not intended to limit the scope of the disclosure.

Terms used herein are only used to describe the specific embodiments, which are not used to limit the claims appended herewith. Unless limited otherwise, the term "a," "an," "one" or "the" of the single form may also represent the plural form.

In the following description and claims, the term "coupled" along with their derivatives, may be used. In particular embodiments, "coupled" may be used to indicate that two or more elements are in direct physical or electrical contact with each other, or may also mean that two or more elements may not be in direct contact with each other. The term "coupled" may still be used to indicate that two or more elements cooperate or interact with each other.

It will be understood that, although the terms "first," "second," . . . etc., may be used herein to describe various signals, elements and/or components, these signals, elements and/or components, should not be limited by these terms. These terms are only used to distinguish signals, elements and/or components.

In the specification, a first terminal and a second terminal of a phase shifter circuit may respectively serve as an input terminal and an output terminal for the phase shifter circuit, and/or may respectively serve as an output terminal and an input terminal for the phase shifter circuit, according to different uses.

Figure 1:
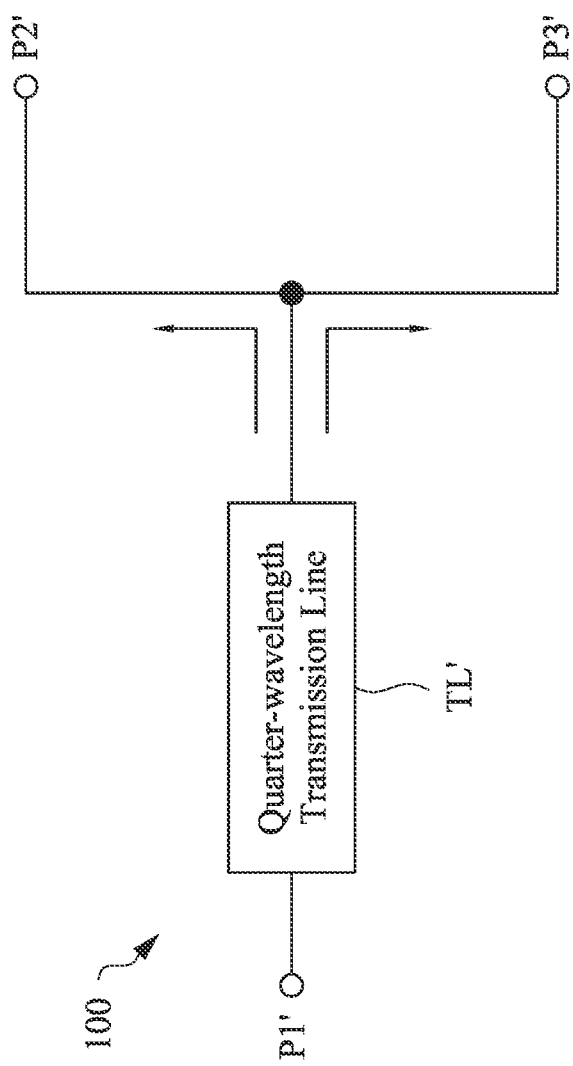
FIG. 1 is a schematic diagram of a conventional power divider in accordance with prior art.
Figure 2:
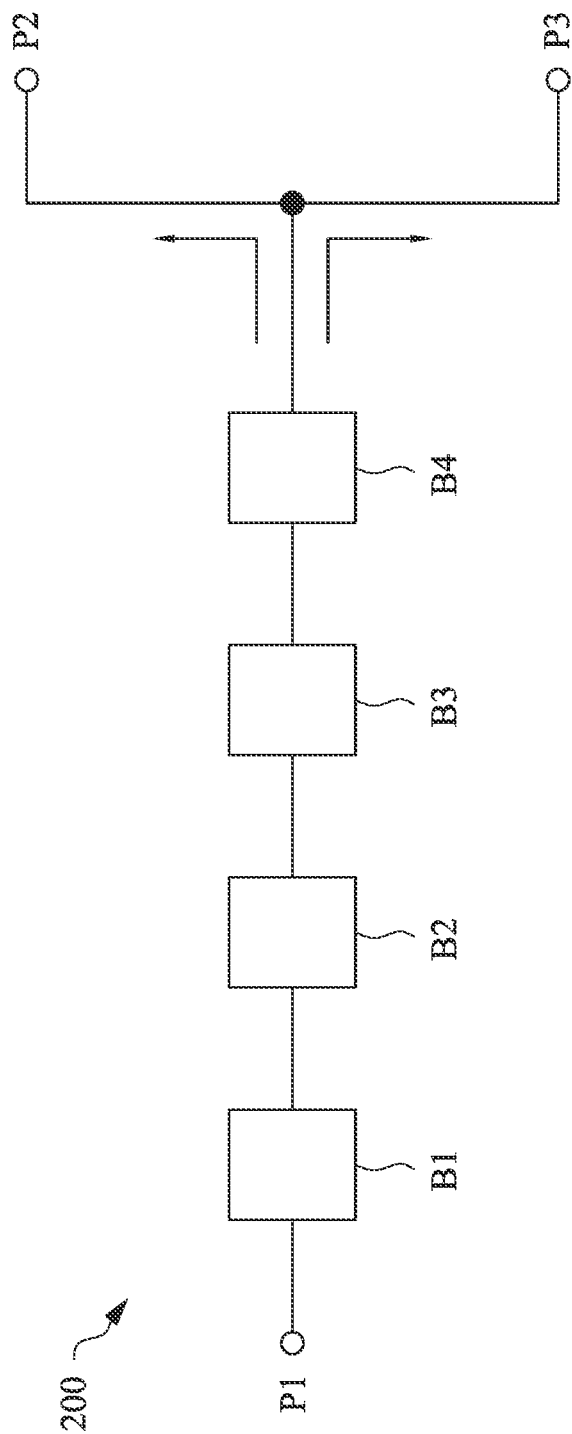
FIG. 2 is a schematic diagram of a power divider in accordance with some implementations of the present disclosure.

FIG. 2 is a schematic diagram of a power divider 200 in accordance with some implementations of the present disclosure. The power divider 200 may be a T-junction power divider, and may be used in a corporate feed network of an antenna array. As shown in FIG. 2, the power divider 200 includes circuit blocks B1, B2, B3 and B4 which are cascaded in series. Each of the circuit blocks B1-B4 has a first terminal and a second terminal. The first terminal of the circuit block B1 is coupled to an input port P1, the first terminals of the circuit blocks B2-B4 are respectively coupled to the second terminals of the circuit blocks B1-B3, and the second terminal of the circuit block B4 is coupled to a node which separates the signal path from the circuit block B4 into two ways respectively to output ports P2 and P3. Each of the circuit block B1-B4 may contribute to a 22.5-degree phase shift, and thus the combination of the circuit blocks B1-B4 of the power divider 200 functions as a quarter-wavelength impedance transformer which provides 90-degree phase shifting as well as impedance matching.

In is noted that the power divider 200 may also be used as a power combiner for combining two signals in different frequency bands and respectively from the output ports P2 and P3. Moreover, the number of circuit blocks in the power divider 200 may be determined according to the design of each circuit block. For example, the power divider 200 may include three circuit blocks coupled in series if each circuit block contributes to a 30-degree phase shift.

Figure 3:
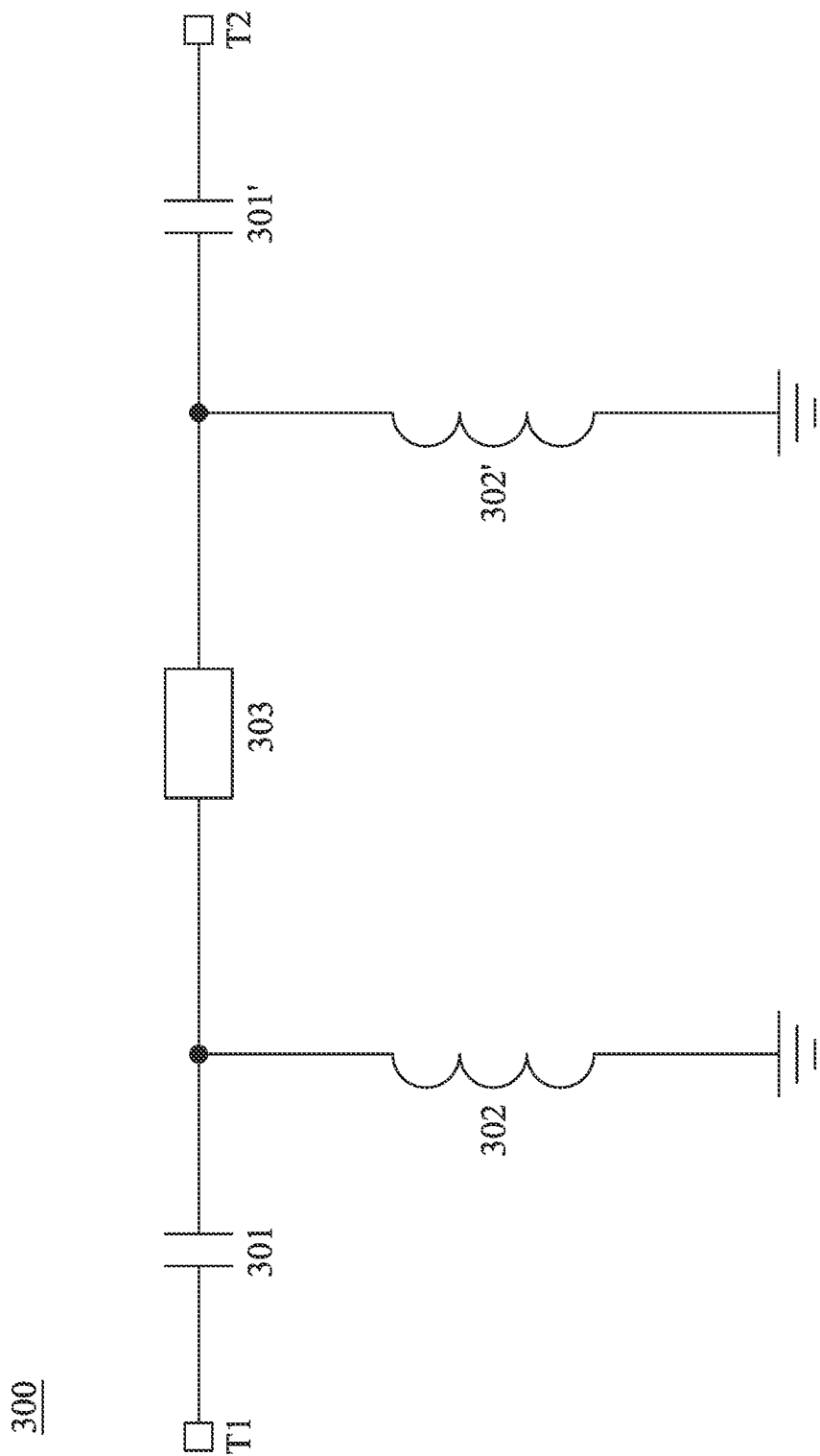
FIG. 3 exemplarily shows a phase shifter circuit in accordance with some implementations of the present disclosure.

FIG. 3 exemplarily shows a phase shifter circuit 300 in accordance with some implementations of the present disclosure. The phase shifter circuit 300 is a phase shifter circuit which may provide a (90/N)-degree phase shift for a signal with two different operating frequencies, where N is an integer. The phase shifter circuit 300 may be an implementation of each of the circuit blocks B1-B4 shown in FIG. 2.

The phase shifter circuit 300 may be regarded as negative refractive index transmission line metamaterial. As shown in FIG. 3, the phase shifter circuit 300 includes capacitors 301 and 301', inductors 302 and 302' and a transmission line 303. The transmission line 303 may be a microstrip or another suitable transmission-line medium. The capacitor 301 is coupled to the inductor 302 in series. One end of the capacitor 301 is coupled to one end of the inductor 302, the other end of the capacitor 301 is coupled to a first terminal T1, and the other end of the inductor 302 is grounded. The capacitor 301' is coupled to the inductor 302' in series. One end of the capacitor 301' is coupled to one end of the inductor 302', the other end of the capacitor 301' is coupled to a second terminal T2, and the other end of the inductor 302' is grounded. One end of the transmission line 303 is coupled to a node between the capacitor 301 and the inductors 302, and the other end of the transmission line 303 is coupled to a node between the capacitor 301' and the inductors 302'. In some implementations, the capacitors 301 and 301' may be variable capacitors, and/or the inductors 302 and 302' may be variable inductors.

The phase shifter circuit 300 may be a symmetrical circuit or an asymmetrical circuit. The point is to have a capacitance coupled in series with the transmission line, and an inductance coupled in parallel with the transmission line, and which is coupled to the ground. The choice of which embodiment among symmetrical and asymmetrical circuits to use depends on preferences and which provides the best physical implementation in any given case. In the aspect of the symmetrical circuit, the capacitance of the capacitor 301 may be substantially the same as the capacitance of the capacitor 301', and the inductance of the inductor 302 may be substantially the same as the inductance of the inductor 302'. The capacitances of the capacitors 301 and 301', the inductances of the inductors 302 and 302' and the length of the transmission line 303 may be determined depending on a required characteristic impedance of the overall phase shifter circuit 300 and desired operating frequencies.

Figure 4:
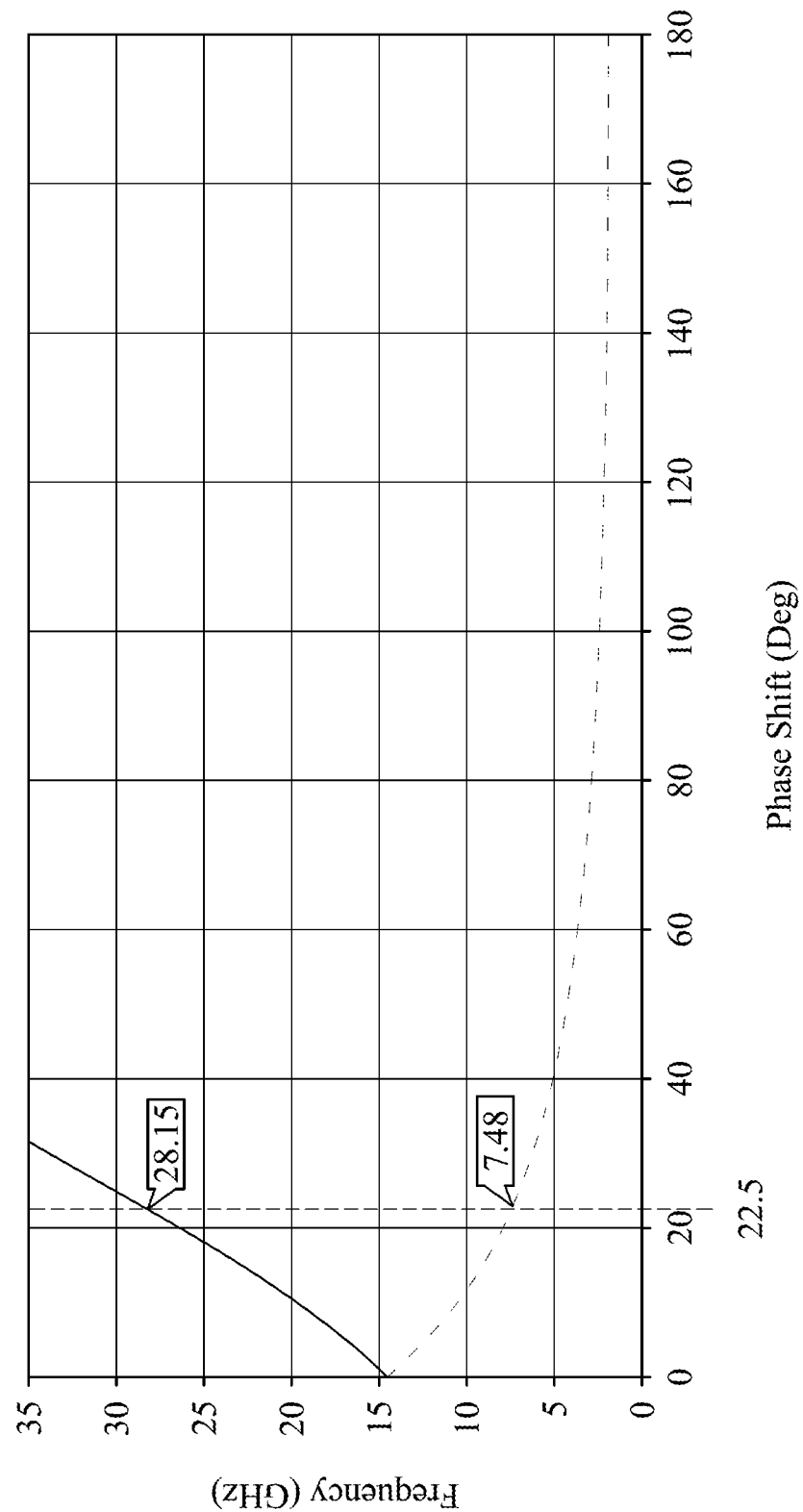
FIG. 4 is a plot depicting the phase shift in degrees (i.e. Deg) of the phase shifter circuit in FIG. 3 versus the frequency in GHz of the input signal.

For example, FIG. 4 is a plot depicting the phase shift in degrees (i.e. Deg) of the phase shifter circuit 300 versus the frequency in GHz of the input signal. For the plot shown in FIG. 4, the capacitance of each of the capacitors 301 and 301' is 2.28 pF, and the inductances of each of the inductors 302 and 302' is 2.85 nH. The phase shift of the phase shifter circuit 300 is 22.5 degrees at the frequency of 7.48 GHz or 28.15 GHz. Referring back to FIG. 2, because each of circuit blocks B1-B4 contributes to a 22.5-degree phase shift, the power divider 200 arrives at a quarter-wavelength phase shift, thereby acting as a quarter-wavelength transmission line at the frequencies of about 7.5 GHz and about 28 GHz.

Figure 5:
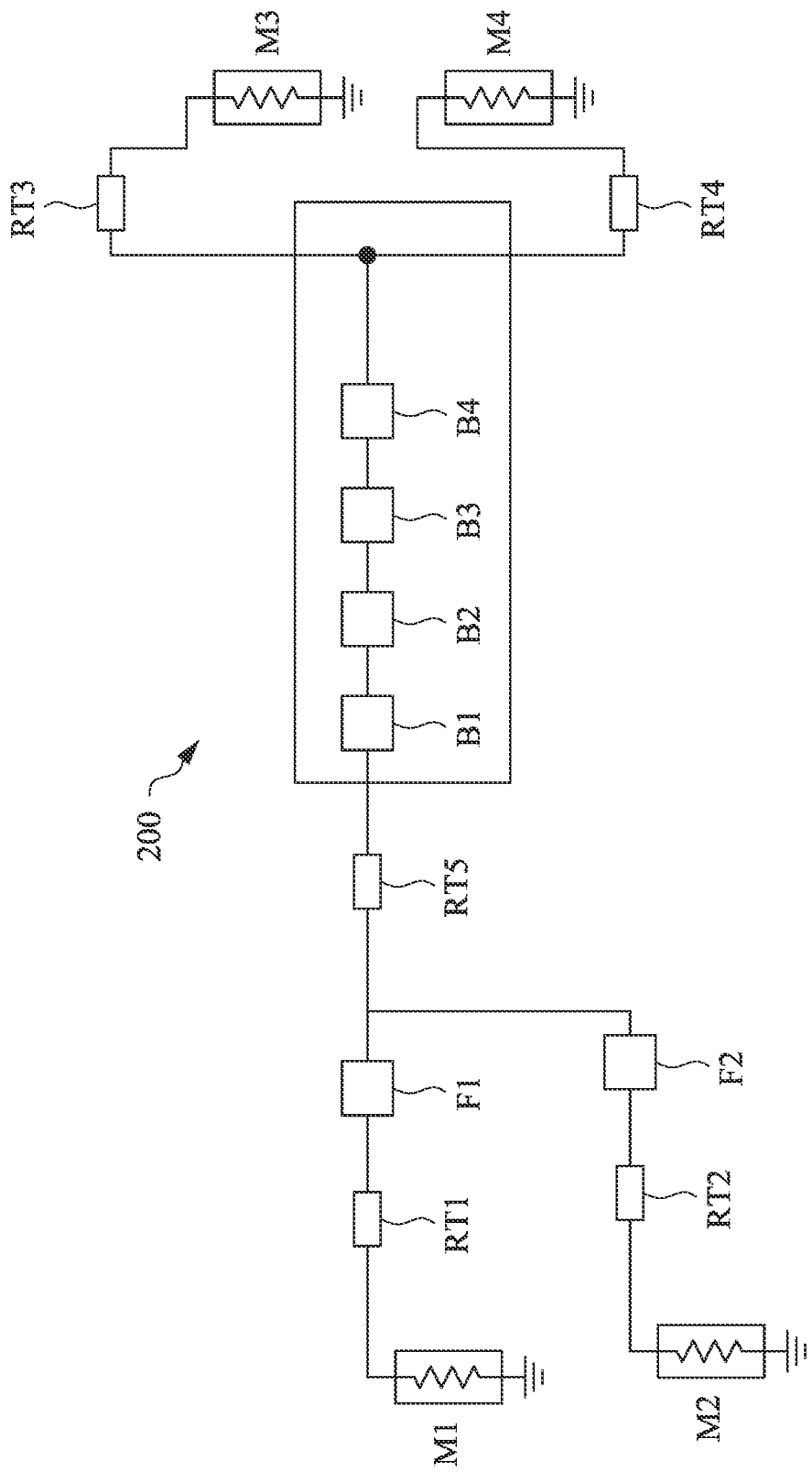
FIG. 5 exemplarily illustrates a configuration in which the power divider in FIG. 2 is coupled the with a test bed.

FIG. 5 exemplarily illustrates a configuration in which the power divider 200 is coupled with a test bed. The input port of the power divider 200 including circuit blocks B1, B2, B3, and B4 is coupled to two signal input circuits, and the output ports of the power divider 200 are respectively coupled to two signal output circuits. One of the signal input circuits may include an input load M1, a transmission line RT1 and a band stop filter F1 coupled in series, and the other of the signal input circuits may include an input load M2, a transmission line RT2 and a band stop filter F2 coupled in series. The band stop filter F1 is used to cutoff a signal component within a first frequency band, and the band stop filter F2 is used to cutoff a signal component within a second frequency band different from the first frequency band. In some implementations, the band stop filter F1 may be substituted with a band pass filter which is used to pass a signal component within the second frequency band, and the band stop filter F2 may be substituted with a band pass filter which is used to pass a signal component within the first frequency band. One of the signal output circuits may include an output load M3 and a transmission line RT3 coupled in series, and the other one of the signal output circuits may include an output load M4 and a transmission line RT4 coupled in series. In addition, a further transmission line RT5 may be coupled between the power divider 200 and the signal input circuits. In some implementations, the band stop filter F1, the band stop filter F2 and/or the transmission line RT5 may be a part of the power divider 200.

Figure 6:
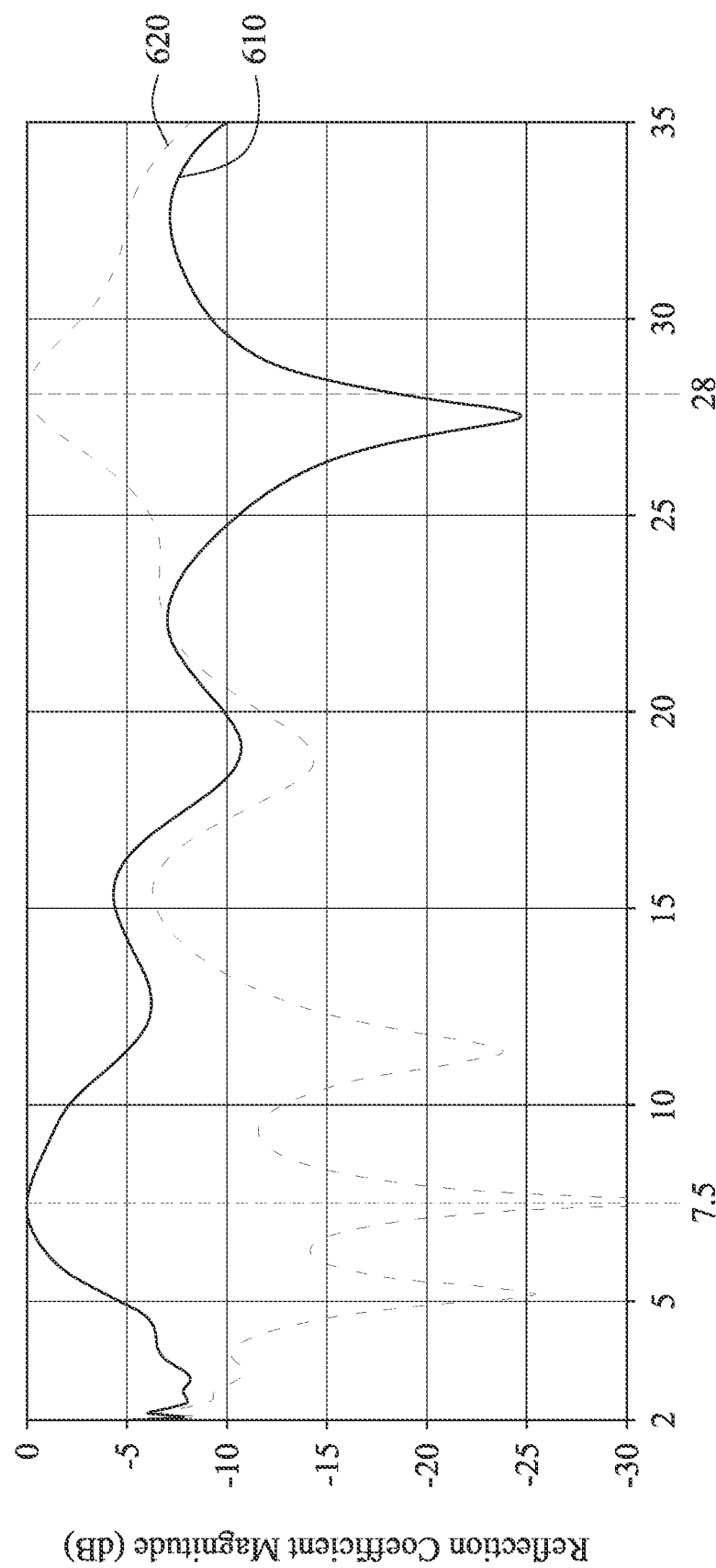
FIG. 6 is a plot depicting the reflection coefficient magnitude in dB versus frequency in GHz of the configuration in FIG. 5.

FIG. 6 is a plot depicting the reflection coefficient magnitude in dB versus frequency in GHz of the configuration in FIG. 5 in which the input loads M1 and M2 are configured to respectively provide a 28 GHz input signal and a 7.5 GHz input signal for some implementations. In FIG. 6, the curve 610 represents the reflection coefficient of the input load M1 in the signal input circuit with the band stop filter F1 of which the center cutoff frequency is about 7.5 GHz, and the curve 620 represents the reflection coefficient of the input load M2 in the signal input circuit with the band stop filter F2 of which the center cutoff frequency is about 28 GHz. As shown in FIG. 6, at the frequency of about 28 GHz, the reflection coefficient of the input load M1 reduces to be approximately −25 dB, while the reflection coefficient of the input load M2 is approximately 0 dB; at the frequency of about 7.5 GHz, the reflection coefficient of the input load M1 is approximately 0 dB, while the reflection coefficient of the input load M2 reduces to be less than −30 dB. As can be seen from FIG. 6, the power divider 200 in FIG. 2 provides good reflection coefficient performances at two different frequencies respectively associated with two input signals.

Figure 7:
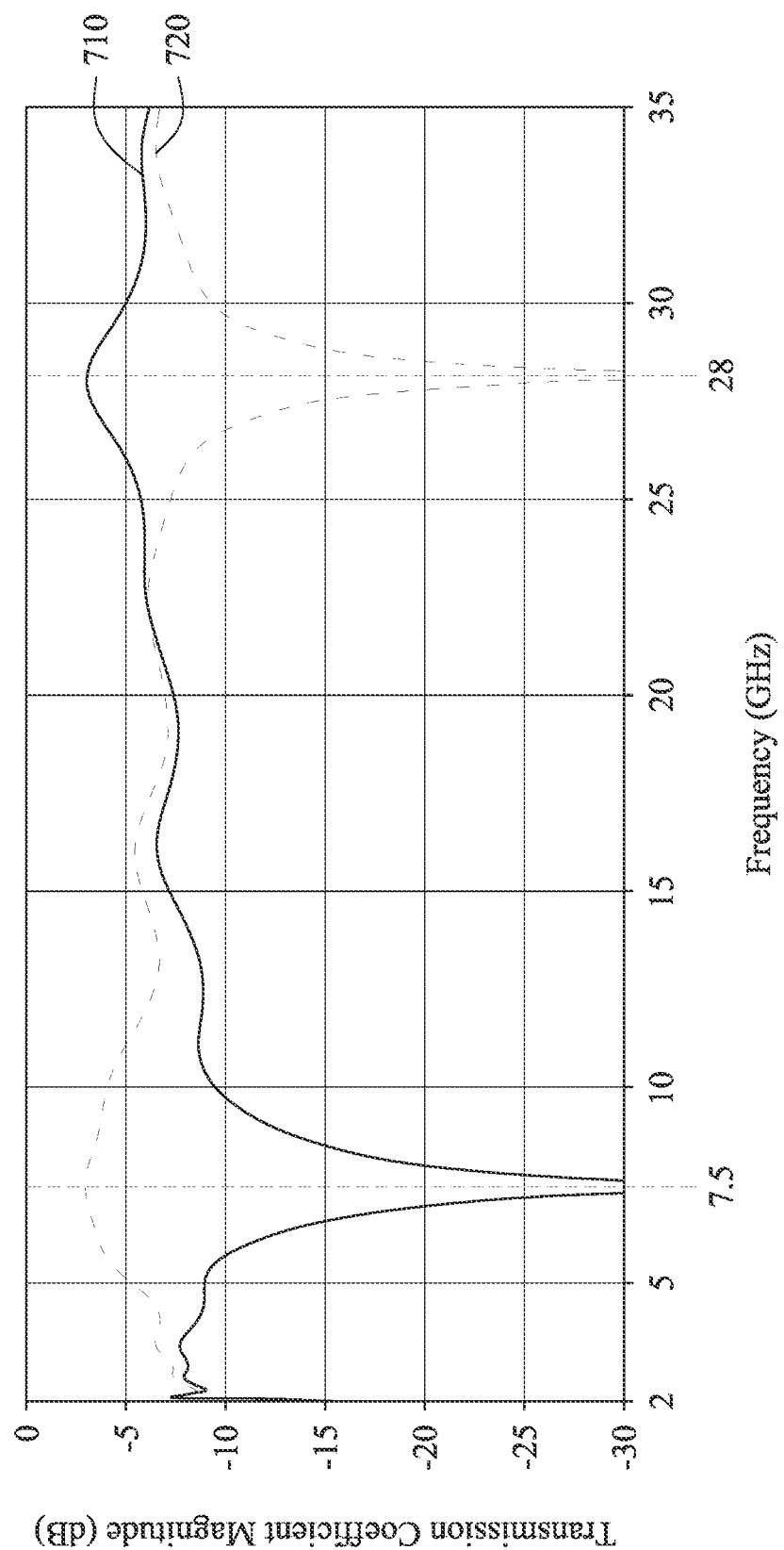
FIG. 7 is a plot depicting the transmission coefficient magnitude in dB versus frequency in GHz of the configuration in FIG. 5.

FIG. 7 is a plot depicting the transmission coefficient magnitude in dB versus frequency in GHz of the configuration in FIG. 5. In FIG. 7, the curve 710 represents the transmission coefficient from the input load M1 to the output load M3, and the curve 720 represents the transmission coefficient from the input load M2 to the output load M3. As shown in FIG. 7, at the frequency of about 28 GHz, the transmission coefficient from the input load M1 to the output load M3 is approximately −3 dB, while the transmission coefficient from the input load M2 to the output load M3 is reduced to be less than −30 dB; at the frequency of about 7.5 GHz, the transmission coefficient from the input load M1 to the output load M3 is reduced to be less than −30 dB, while the transmission coefficient from the input load M2 to the output load M3 is approximately −3 dB. In addition, the transmission coefficient from the input load M1 to the output load M4 is approximately the same as the transmission coefficient from the input load M1 to the output load M3, and the transmission coefficient from the input load M2 to the output load M4 is approximately the same as the transmission coefficient from the input load M2 to the output load M3. As can be seen from FIG. 7, the power divider 200 in FIG. 2 is capable of dividing power of the input signal with two different operating frequencies into two output signals with equal power.

Figure 8A:
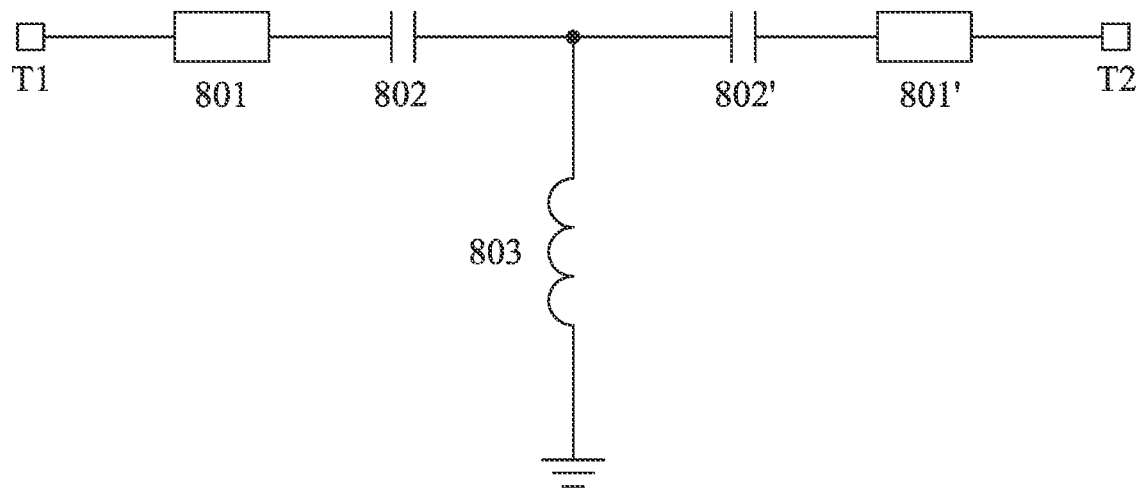
FIGS. 8A-8D respectively show phase shifter circuits in accordance with various implementations of the present disclosure.
Figure 8B:
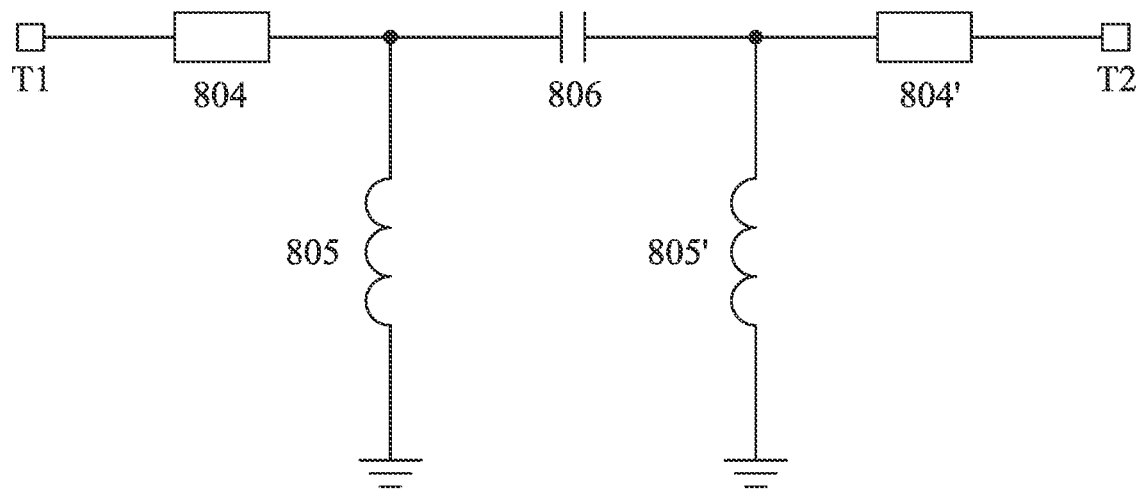

Alternative configurations of the phase shifter circuit 300 in FIG. 3 are also possible. FIG. 8A and FIG. 8B respectively show phase shifter circuits 800A and 800B in accordance with some implementations of the present disclosure, which are other symmetric versions of the phase shifter circuit 300. In FIG. 8A, the phase shifter circuit 800A includes transmission lines 801 and 801', capacitors 802 and 802' and an inductor 803 which form a T-shaped circuit, where the transmission line 801 and the capacitor 802 are coupled in series, and mirrored about the inductor 803 to produce the transmission line 801' and the capacitor 802'. The capacitor 802 has two opposite ends respectively connected to one end of the transmission line 801 and a non-grounded end of the inductor 803, and the other end of the transmission line 801 is coupled to a first terminal T1. Similarly, the capacitor 802' has two opposite ends respectively connected to one end of the transmission line 801' and the non-grounded end of the inductor 803, and the other end of the transmission line 801' is coupled to a second terminal T2. In FIG. 8B, the phase shifter circuit 800B includes transmission lines 804 and 804', inductors 805 and 805' and a capacitor 806 which form a π-shaped circuit, where the transmission line 804 and the inductor 805 are connected in parallel and mirrored about the capacitor 806 to form the transmission line 804' and the inductor 805'. The inductor 805 has two opposite ends respectively coupled to one end of the transmission line 804 and the ground, and the other end of the transmission line 804 is coupled to a first terminal T1. Similarly, the inductor 805' has two opposite ends respectively connected to one end of the transmission line 804' and the ground, and the other end of the transmission line 804' is coupled to a second terminal T2.

Figure 8C:
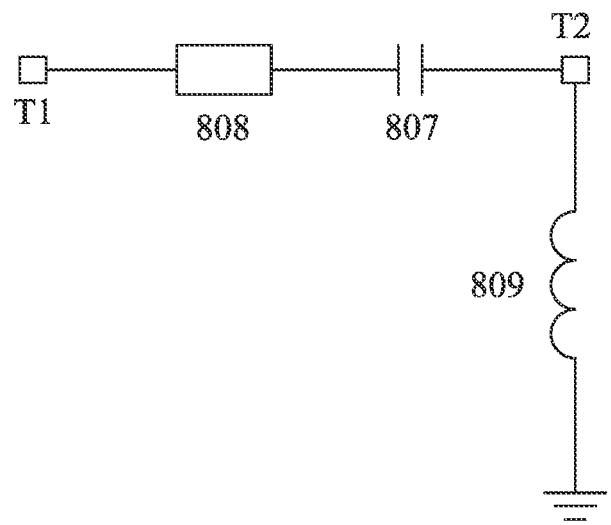

FIG. 8C shows a phase shifter circuit 800C in accordance with some implementations of the present disclosure, which is another functionally equivalent version of the phase shifter circuit 300 in FIG. 3. In FIG. 8C, the phase shifter circuit 800C is asymmetric, and includes a capacitor 807, a transmission line 808 and an inductor 809. In this case, the transmission line 808, the capacitor 807 and the inductor 809 are sequentially coupled in series, and the inductor 809 is coupled to the ground. The two opposite ends of the transmission line 808 are respectively coupled to the capacitor 807 and a first terminal T1, and the two opposite ends of the inductor 809 are respectively coupled to the ground and a second terminal T2.

Figure 8D:
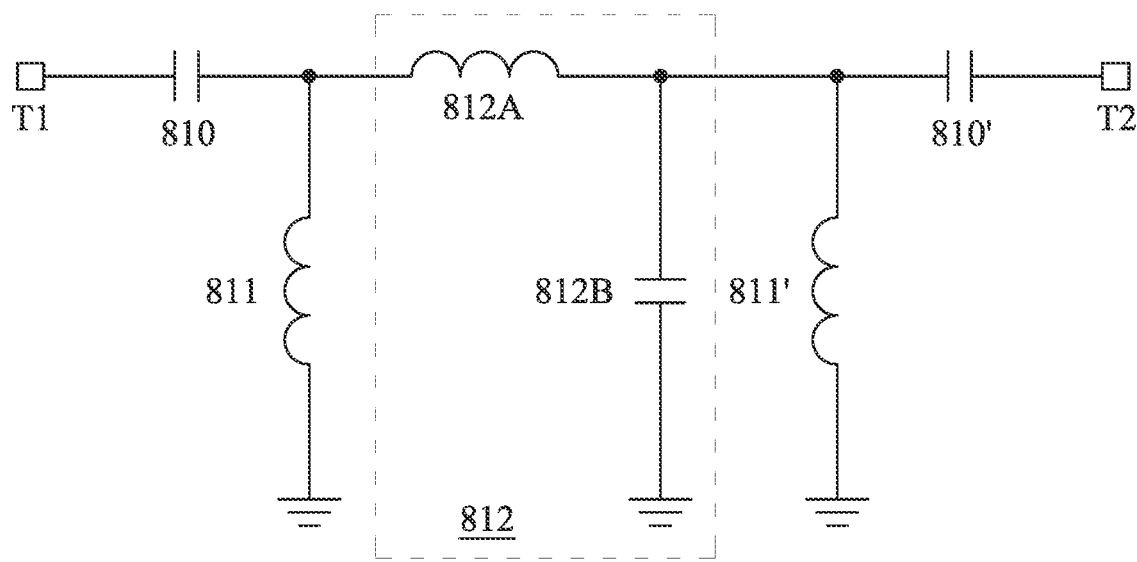

Furthermore, a design based on discrete elements only, as shown in FIG. 8D, would be functionally identical to the foregoing phase shifter circuits; such a design is realized by replacing all instances of the transmission line (e.g. the transmission line 801 in FIG. 8A) with an inductor-capacitor (LC) circuitry. This modification may be applied to any of the embodiments of this disclosure. For example, FIG. 8D shows a phase shifter circuit 800D in accordance with some implementations of the present disclosure, which is a modification of the phase shifter circuit 300. In FIG. 8D, the phase shifter circuit 800D includes capacitors 810 and 810', inductors 811 and 811' and an LC circuitry 812. The phase shifter circuit 300 in FIG. 3 and the phase shifter circuit 800D in FIG. 8D are similar, except that the LC circuitry 812 is adopted in the phase shifter circuits 800D in place of a transmission line. The LC circuitry 812 includes an inductor 812A that is in a series branch of the phase shifter circuit 800D and a capacitor 812B that is in a shunt branch of the phase shifter circuit 800D. One end of the inductor 812A is coupled to a node between the capacitor 810 and the inductor 811, and the other end of the inductor 812A is coupled to a node between the capacitor 810' and the inductor 811'. One end of the capacitor 812B is coupled to the ground, and the other end of the capacitor 812B is coupled to the node between the capacitor 810' and the inductor 811'. One end of the capacitor 810 is coupled to one end of the inductor 811, the other end of the capacitor 810 is coupled to a first terminal T1, and the other end of the inductor 811 is grounded. One end of the capacitor 810' is coupled to one end of the inductor 811', the other end of the capacitor 810' is coupled to a second terminal T2, and the other end of the inductor 811' is grounded.

Figure 9:
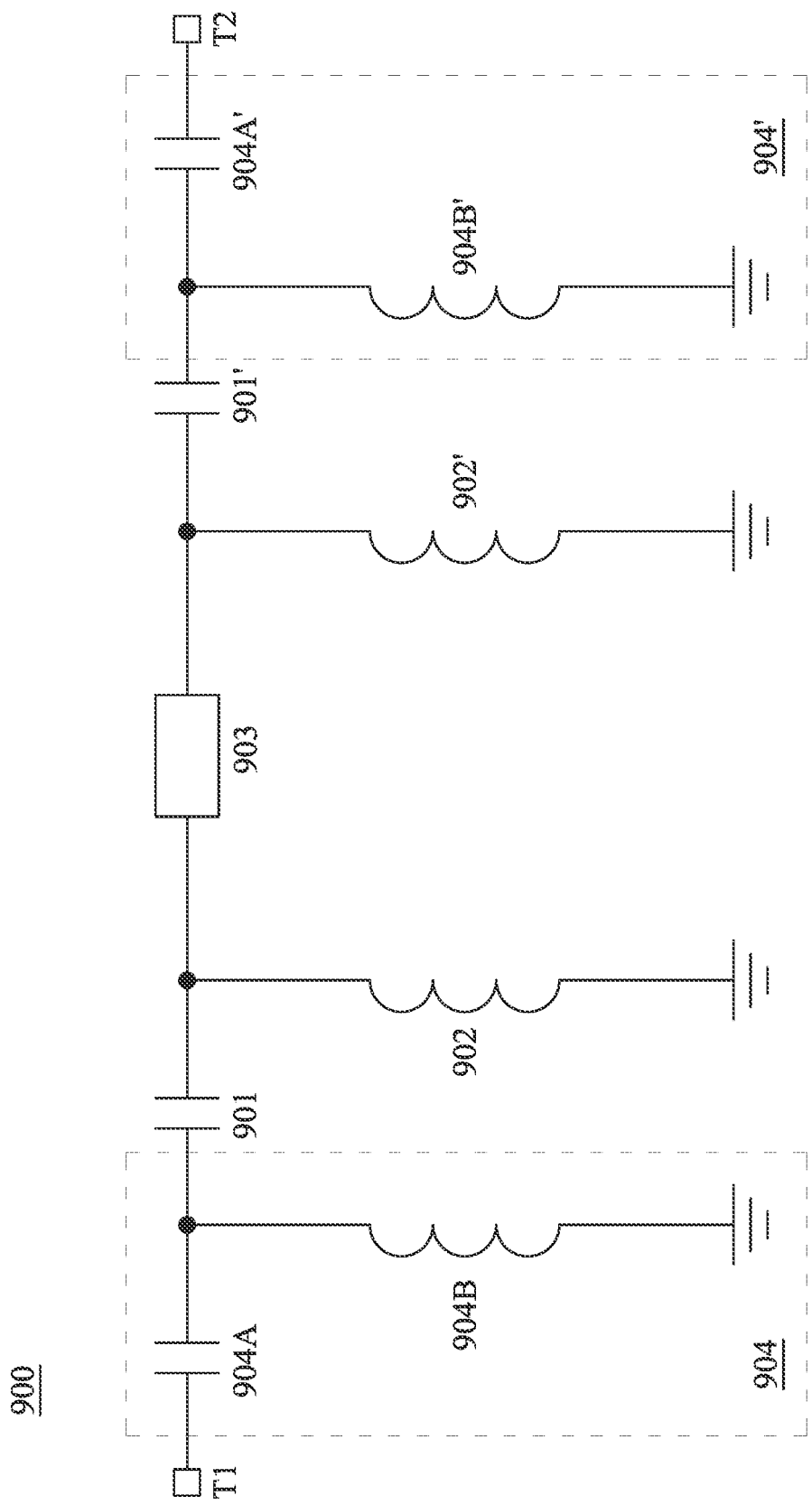
FIG. 9 shows one example of a phase shifter circuit for a power divider that is capable of dividing a signal with more than two operating frequencies.

The power divider in accordance with the implementations of the present disclosure may be modified to divide a signal with more than two operating frequencies. FIG. 9 shows one example of a phase shifter circuit 900 for such a power divider, in which an extra LC circuitry is added to each side thereof. As shown in FIG. 9, the phase shifter circuit 900 includes capacitors 901 and 901', inductors 902 and 902' and a transmission line 903 as well as LC circuitries 904 and 904'. The capacitors 901 and 901', the inductors 902 and 902' and the transmission line 903 are respectively similar to the capacitors 301 and 301', the inductors 302 and 302' and the transmission line 303 of the phase shifter circuit 300. The LC circuitries 904 and 904' are added in the phase shifter circuit 900 for increasing operating frequencies. The LC circuitry 904 is coupled between the capacitor 901 and a first terminal T1, and includes a capacitor 904A and an inductor 904B which are coupled in series. The capacitor 904A is coupled to the first terminal T1, the inductor 904B is coupled in parallel to the capacitor 901 and has one end coupled to the ground, and the capacitor 901 is coupled to a node between the capacitor 904A and the inductor 904B. The capacitance of the capacitor 904A and the inductance of the inductor 904B may be different from the capacitance of the capacitor 901 and the inductance of the inductor 902, respectively, and may be chosen based on the desired operating frequencies. Similarly, the LC circuitry 904' is coupled between the capacitor 901' and a second terminal T2, and includes a capacitor 904A' and an inductor 904B' which are coupled in series. The capacitor 904A' is coupled to the second terminal T2, the inductor 904B' is coupled in parallel to the capacitor 901' and has one end coupled to the ground, and the capacitor 901' is coupled to a node between the capacitor 904A' and the inductor 904B'. The capacitance of the capacitor 904A' and the inductance of the inductor 904B' may be different from the capacitance of the capacitor 901' and the inductance of the inductor 902', respectively, and may be chosen based on the desired operating frequencies.

The phase shifter circuit 900 may operate at three different operating frequencies, and in general, the number of operating frequencies will correspond to the number of unique LC circuitries, including those approximated by the transmission line thereof. The same concept of adding inductor-capacitor circuitries may equally be applied to any of the alternative embodiments.

Additionally, the power divider shown in FIG. 2 is a two-way power divider in which the signal path is divided into 2-way outputs, but the present disclosure is not limited thereto. A person having ordinary skill in the art would be able to modify the power divider described herein to arrive at a multi-way power divider with multi-way outputs.

Furthermore, two or more power dividers in accordance with the implementations of the present disclosure may be cascaded to form a multi-way cascade power divider. For example, the input ports of two power dividers may be respectively coupled to the output ports of another power divider to form a four-way cascade power divider.

According to the above descriptions, the power divider in accordance with the implementations of the present disclosure can realize power divider for a signal with two or more operating frequencies which are not constrained to be harmonics of a fundamental operating frequency, and can be reused for multiple signals, so as to reduce the product cost. In addition, the power divider in accordance with the embodiments of the present disclosure can reduce the required layout area because the length of the cascaded circuit blocks is not limited to a quarter of the wavelength of the signal in the power divider.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims.

What is claimed is:

1. A phase shifter circuit providing a (90/N)-degree phase shift for a signal with two or more operating frequencies, where N is an integer, and the phase shifter circuit comprising:
   a first inductor that is grounded;
   a first capacitor coupled to the first inductor in series;
   a second inductor that is grounded, wherein inductances of the first inductor and the second inductor are substantially the same; and
   a second capacitor coupled to the second inductor in series, wherein capacitances of the first capacitor and the second capacitor are substantially the same;
   wherein a first node between the first capacitor and the first inductor is coupled to a second node between the second capacitor and the second inductor.

2. The phase shifter circuit of claim 1, further comprising:
   a third inductor that is grounded;
   a third capacitor coupled to the third inductor in series;
   a fourth inductor that is grounded; and
   a fourth capacitor coupled to the fourth inductor in series;
   wherein the first capacitor is coupled between the first node and a third node that is between the third capacitor and the third inductor, and the second capacitor is coupled between the second node and a fourth node that is between the fourth capacitor and the fourth inductor.

3. The phase shifter circuit of claim 1, wherein the first node coupled to the second node includes
   a transmission line coupled between the first node and the second node.

4. The phase shifter circuit of claim 3, wherein the transmission line is a microstrip.

5. The phase shifter circuit of claim 1, wherein the first node coupled to the second node includes
   an inductor-capacitor (LC) circuitry coupled between the first node and the second node.

6. The phase shifter circuit of claim 1, wherein an end of the first capacitor opposite to the first node and an end of the second capacitor opposite to the second node provide an input and an output for the signal, respectively.

7. A phase shifter circuit providing a (90/N)-degree phase shift for a signal with two or more operating frequencies, where N is an integer, and the phase shifter circuit comprising:
   a first inductor that is grounded;
   a first capacitor coupled to the first inductor; and
   a first transmission line coupled to the first capacitor;
   wherein the first transmission line, the first capacitor and the first inductor are sequentially coupled in series.

8. The phase shifter circuit of claim 7, further comprising:
   a second capacitor coupled to the first inductor; and
   a second transmission line coupled to the second capacitor;
   wherein the second transmission line, the second capacitor and the first inductor are sequentially coupled in series.

9. The phase shifter circuit of claim 7, further comprising:
   a second inductor that is grounded and coupled to a first node between the first transmission line and the first capacitor; and
   a second transmission line, wherein one end of the second transmission line is coupled to a second node between the first capacitor and the first inductor.

10. A power divider comprising:
    a plurality of circuit blocks cascaded in series, each of the circuit blocks providing a (90/N)-degree phase shift for a signal with two or more operating frequencies, a first terminal of a $1^{st}$ circuit block of the plurality of circuit blocks coupled to an input port of the power divider, a second terminal of an $i^{th}$ circuit block of the plurality of circuit blocks coupled to a first terminal of an $(i+1)^{th}$ circuit block of the plurality of circuit blocks, and a second terminal of an $N^{th}$ circuit block of the plurality of circuit blocks is coupled to two output ports of the power divider, where N is the number of circuit blocks, and i is an integer less than N.

11. The power divider of claim 10, wherein at least one of the plurality of circuit blocks comprises:
    a first inductor that is grounded;
    a first capacitor coupled to the first inductor; and
    a first transmission line coupled to the first capacitor;
    wherein the first transmission line, the first capacitor and the first inductor are sequentially coupled in series.

12. The power divider of claim 11, wherein the at least one of the plurality of circuit blocks further comprises:
    a second capacitor coupled to the first inductor; and
    a second transmission line coupled to the second capacitor;
    wherein the second transmission line, the second capacitor and the first inductor are sequentially coupled in series.

13. The power divider of claim 11, wherein the at least one of the plurality of circuit blocks further comprises:
    a second inductor that is grounded and coupled to a first node between the first transmission line and the first capacitor; and
    a second transmission line, wherein one end of the second transmission line is coupled to a second node between the first capacitor and the first inductor.

14. The power divider of claim 10, wherein at least one of the plurality of circuit blocks comprises:
    a first inductor that is grounded;
    a first capacitor coupled to the first inductor in series;
    a second inductor that is grounded; and
    a second capacitor coupled to the first capacitor in series;

wherein a first node between the first capacitor and the first inductor is coupled to a second node between the second capacitor and the second inductor.

15. The power divider of claim 14, wherein the at least one of the plurality of circuit blocks further comprises: the first node coupled to the second node through
   a transmission line coupled between the first node and the second node.

16. The power divider of claim 14, wherein the at least one of the plurality of circuit blocks further comprises: the first node coupled to the second node through
   an inductor-capacitor (LC) circuitry coupled between the first node and the second node.

17. The power divider of claim 14, wherein the at least one of the plurality of circuit blocks further comprises:
   a third inductor that is grounded;
   a third capacitor coupled to the third inductor in series;
   a fourth inductor that is grounded; and
   a fourth capacitor coupled to the fourth inductor in series;
   wherein the first capacitor is coupled between the first node and a third node that is between the third capacitor and the third inductor, and the second capacitor is coupled between the second node and a fourth node that is between the fourth capacitor and the fourth inductor.

* * * * *